(12) United States Patent
Hirofuji et al.

(10) Patent No.: US 6,647,529 B2
(45) Date of Patent: Nov. 11, 2003

(54) CHIEN'S SEARCHING APPARATUS

(75) Inventors: Masanori Hirofuji, Ibaraki (JP); Yoshitaka Hanaki, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 483 days.

(21) Appl. No.: 09/761,195

(22) Filed: Jan. 18, 2001

(65) Prior Publication Data

US 2001/0052103 A1 Dec. 13, 2001

(30) Foreign Application Priority Data

Jan. 18, 2000 (JP) ........................................ 2000-009361

(51) Int. Cl.[7] .............................................. H03M 13/00
(52) U.S. Cl. ........................................ 714/784; 714/782
(58) Field of Search ................................. 714/781, 782, 714/784

(56) References Cited

U.S. PATENT DOCUMENTS 5,107,503 A    4/1992  Riggle et al. .............. 371/37.1
5,384,786 A  * 1/1995  Dudley et al. .............. 714/784
5,666,369 A  * 9/1997  Nakamura ................... 714/781
6,192,497 B1   2/2001  Yang et al. ................. 714/781

FOREIGN PATENT DOCUMENTS

| JP | 62-122333 | 3/1987 |
| JP | 63-123231 | 5/1988 |
| JP | 63-131623 | 6/1988 |
| JP | 2-501256  | 4/1990 |
| JP | 6-314978  | 11/1994 |
| JP | 2000-315955 | 11/2000 |
| JP | 2001-044853 | 2/2001 |
| JP | 2001-196938 | 7/2001 |

* cited by examiner

*Primary Examiner*—Albert Decady
*Assistant Examiner*—Joseph D. Torres
(74) *Attorney, Agent, or Firm*—Parkhurst & Wendel, L.L.P.

(57) ABSTRACT

The present invention attempts to speed up operations by a chien's searching apparatus used in error correction, to thereby miniaturize it and save on its power dissipation. To this end, the apparatus includes a plurality of arithmetic units which share an error-position polynomial calculating unit and an error-numeral polynomial calculating unit as well as selectors and registers, to thereby perform calculation on a plurality of orders in the same cycle. Also, a divider unit is shared in use. If no error is found, the divider unit is stopped.

9 Claims, 8 Drawing Sheets

Example of ECC (Error Correction Code) format for DVD

■ Product Code with an additional of duplicated parity bits of horizontal (inner) and vertical (outer) bits ■ Horizontal: 172 data bits, 10 parity bits (5 error correction bits at maximum) × 208 codes
Vertical: 182 data bits, 16 parity bits (8 error correction bits at maximum) × 182 codes

CHIEN'S SEARCHING APPARATUS

BACKGROUND OF THE INVENTION (1) Field of the Invention

The present invention relates to an error correcting method and, more particularly to, a technology for speedily solving an error-position polynomial for chien's searching used in error correction.

(2) Description of the Related Art

General Background of the Technology

Digital data written on a DVD-ROM and the like may produce a read-out error due to a fingerprint, other dirt, a scar, or the like if the data is read out as is. In order to cope with this, when data which is stored by use of a Reed-Solomon code is read out, an algorithm called chien's searching is used to find an error position or error numeral for correction.

This is done so, because an odd/even parity check method which only adds one bit to every original seven data bits can find error generation itself but cannot specify error data nor find the generation itself in case two errors occur simultaneously, so that by providing a large number of parity bits in a duplicate manner, i.e. both horizontally and vertically, to thereby reduce a question of "correcting an error" to a question of "solving a simultaneous equation." The Reed-Solomon code itself is a known technology already described in, for example, "INTRODUCTION TO CODE THEORY" by Iwadare, published by Shouseidou, "PRACTICAL ERROR CORRECTION TECHNOLOGY" published by Trikeppsu, and the like. Also, arrays of data and parity bits on a DVD-ROM and the like and the ECC format are also already known. Therefore, detailed description on these issues is omitted here, and outlining only those items directly related to the present invention.

As shown in FIG. 1, 1 (one) ECC (error correction code) according to a DVD format comprises a rectangular-shaped data portion consisting of horizontal 172 bytes and vertical 182 bytes and additional two parity portions of a rightward 10-byte portion and a downward 16-byte portion.

With this, data read out from a DVD-ROM and the like is sent through a syndrome arithmetic unit, an Euclidean arithmetic unit and to a chien's searching apparatus (error-position and numeral calculation unit).

In this configuration, the Euclidean arithmetic unit and the chien's searching apparatus are provided for speeding, because an equation of interest cannot be solved if the number of employed parity bits is too large, such as 10 or 16.

In this configuration, the Euclidean arithmetic unit on the upstream side obtains an error-position polynomial L(X) and an error-numeral polynomial V(X) based on a syndrome polynomial S(X). In this case, a code polynomial C(X) uses d data pieces Di (i=0, 2, ..., d-1) and p parity bits Pi (i=0, ..., p-1) as coefficients in this order. Also, S(X) is obtained by substituting a root of a generation polynomial G(X) into a reception polynomial R(X) received. Note here that the parity bit of the code polynomial C(X) is added so that C(X) can be exactly divided by the generation polynomial G(X) having the parity bits as sequential coefficients. Also, the error-position polynomial L(X) is provided to obtain an error position Lj, while the error-numeral polynomial V(X) is provided to obtain an error numeral Ej.

With this, the error-position polynomial L(X) has X=α^−Lj (−Lj'th power of α) as a solution. Further, a relation of Ej=−V(α^Lj)/Lodd(α^−Lj) holds. This mathematical expression is called an error-numeral polynomial. In this expression, the denominator Lodd is a function of only an odd-number order of the error-position polynomial L(X), while α is a root of the generation function C(X).

With this, X=α^0, α^1, α^2, ... are substituted as a solution on a Galois field GF (2^n; n'th power of 2) into an error-position polynomial L(X) obtained by the Euclidean algorithm, to thereby obtain a solution that a total sum of each bit component becomes 0. The Galois field and arithmetic operations thereon are known from disclosures in, for example, "MODERNE ALGEBRA" by B. L. van der Waerden, published by Springer Verlag, and the like, and a Galois field multiplier is also a so-called known technology, so that description on these issues is omitted here.

Note here that this error-position polynomial L(X) is expressed as follows if it has a maximum correction power p:

$$L(x) = A_p X^p + \ldots + A_2 x^2 + A_1 X^1 + A_0$$

where A0–Ap are all coefficients of the 0'th power through the p'th power of X.

Such a circuit is called a chien's searching (apparatus) that is constituted to solve this equation on a real-time basis, i.e. corresponding to a situation that one actually appreciates music or pictures, to thereby find an error position and obtain an error numeral. FIG. 2 shows the denominator of this chien's searching apparatus, i.e. the calculation unit of the above mentioned L(α^−Lj).

In FIG. 2, a reference numeral 100 indicates an error-position calculating (also referred to as an error-position arithmetic) unit, i.e. the error-position polynomial calculating unit. Reference numerals 1010–101*p* indicate input terminals. Reference numerals 1020–102*p* indicate Galois field multipliers. Reference numerals 1030–103*p* indicate selectors (circuits). Reference numerals 1040–104*p* indicate registers or overwritable memories. A reference numeral 105 indicates a full adder (aggregate batcher). A reference numeral 106 indicates a 0-decoder. A reference numeral 107 indicates an odd-number order summing (aggregate) unit. A reference numeral 108 indicates an error-location counter. A reference numeral 109 indicates an error-location output signal terminal. A reference numeral 110 indicates an arithmetic-unit output-signal terminal. A reference numeral 111 indicates an even-number order sum output signal terminal.

With this, at the first cycle, each coefficient of an error-position polynomial is input from the Euclidean arithmetic unit (not shown) on the upstream side to their corresponding input terminals 1010–101*p*. The selectors 1030–103*p* following to each input terminal for each input terminals select a coefficient input from each of the input terminal 1010–101*p* at the beginning of only the initial cycle or at the start of the corresponding cycle and, during the subsequent cycle, always select as an input the output value from each of the Galois field multipliers 1020–102*p*, which is the other input signal. With this, according to the following procedure, α^0, α^1, α^2, ... are sequentially substituted into X in the subsequent cycles, to thereby check one by one whether L(X)=0 or not.

Values selected by each of the selectors 1030–103*p* are respectively stored in the following registers 1040–104*p* in synchronization with a system clock signal, which values are then summed by the following full adder 105 at the beginning of the next cycle. This sum value is judged whether it is 0 or not by the 0-decoder 106. If it is judged as 0, j indicates an error position.

The reference numeral 108 indicates the error-location counter, which is reset to 0 at the first cycle and then counts up by one per every one clock cycle. That is, this error-location counter always stores a value of i+1 for every i cycles, so that its count value, when the o-decoder has judged as 0, indicates an error position.

In the cycle following the initial cycle, each value stored in each of the registers 1040–104p are respectively multiplied by $\alpha^0, \alpha^1, \ldots, \alpha^p$ by the Galois field multipliers 1020–102p which branch from and follow the full adder 105, so that thus obtained products are respectively stored via the selectors 1030–103p newly in the registers 1040–104p in lace of the previous values.

A reference numeral 107 indicates an odd-number order full adder for summing only odd-number order terms in error polynomials. Thus obtained results are used in a divisor unit of the next-stage error-numeral polynomial arithmetic unit (not shown), to obtain an error numeral by utilizing the above mentioned relation.

Subsequently, this arithmetic operation to thereby decide the presence of an error and detect the error position.

Also, the error-location output terminal 109, the 0-decoder terminal 110, and the odd-number order sum output signal terminal 111 serve to provide their respective output signals to the arithmetic unit of the next-stage error-numeral polynomial.

FIG. 3 shows all the chien's searching apparatus.

As shown in it, the chien's searching apparatus comprises part of the error-position polynomial calculating unit 100 as shown in FIG. 2 and the denominator unit (denominator side arithmetic unit) consisting of the odd-number order summing unit 107 and the additional numerator unit (numerator side arithmetic unit) 300 and the error-numeral polynomial divisor unit (i.e., processing unit for the purpose of specifying an error position) 500, thus calculating an error numeral. In this configuration, the numerator unit 300 is provided for operating the above mentioned $-V(\alpha^-Lj)$, being different from the above mentioned error-position polynomial calculating unit 100 in the following four points:

1) In the initial cycle, there is present no p'th-order coefficient to be input;
2) Therefore, there is no Galois field multiplier present for this coefficient;
3) A different coefficient is to be input; and
4) There are no odd-number order summing unit nor 0-decoder.

With this, therefore, every element or component having the same actions as those in FIG. 2 has "3" in place of "1" as the initial number (top digit) of the reference numeral. Specifically, with the selectors, for example, since the error-position polynomial calculating units are given the reference numerals 1031–103p, the numerator units have reference numerals 3031–303p-1 (303p does not exist). Note here that a reference numeral 312 indicates an output signal terminal of the numerator units of the error-numeral polynomial and a reference numeral 514, an output signal terminal of the error-numeral polynomial divisor.

With this configuration, numerators of the above mentioned error-numeral polynomial are operated, to send thus obtained operation result to the error-numeral polynomial divisor 500. With this, the error-numeral polynomial divisor 500 uses this value as a numerator and an output signal terminal 111 of the odd-number order summing unit 107 of the error-position polynomial calculating unit 100 as a denominator, to thereby calculate an error numeral and place the result as an output.

With this further, subsequently, an error write-back device (not shown) rewrites data in a buffer memory as required, change a read-out speed, as required, for re-reading, changes an correction algorithm, and finally displays images on a CRT based on thus rewritten correct data. These technologies, however, are already known, so that their description on these issued is omitted here.

Background Technologies from the Perspective of the Problems to be Solved by the Present Invention Improvements in recent years have increased the amount of data subject to error correction. This lead to needs for further speedy error correction processing for improvement in the reproduction speed of DVD-ROMs.

The above mentioned chien's searching apparatus, however, can obtain only one solution by one-cycle time operations because of its error-position calculations. Its throughput, therefore, is determined by the one-cycle time lapse, a frequency of its clock signal, etc. If, to improve the throughput, the frequency of its driving clock signal is increased or the operational cycle time is decreased, however, the power dissipation is increased, the skew of the clock signal becomes difficult to adjust, the signal cannot easily swing full to thus permit hot carriers to cause reliability deterioration or signal propagation abnormality, adjustment is required with other equipment and circuits, or other problems may occur.

Similar problems would occur also with error-numeral calculations.

These problems led to need for the development of a technology that permits a chien's searching apparatus to obtain solutions of an error-position polynomial speedily without increasing the cycle frequency.

Besides, because of the recent miniaturization and portability of various types of equipment using DVD-ROMs or otherwise, there have been strong desires for miniaturization and lower power dissipation of the various components. With this, in view of the above, there have been desires in the industries for the development of an appropriate chien's searching apparatus.

Also, like in other technological fields, detailed study of the processing contents has found a possibility that they may contain unnecessary processing items. This led to a request for detailed review of the processing contents for further speeding in processing.

SUMMARY OF THE INVENTION

It is an object of the present invention to solve the above mentioned problems, actually taking notice of reducing an error rate. It is another object of the present invention to provide a plurality of arithmetic units to thereby speed arithmetic operations as well as miniaturize and reduce power dissipation of an apparatus. Specifically, the apparatus has the following configuration.

In the first aspect of the present invention, the so-called denominator side of a portion for error-position calculations in the apparatus which calculates an error position and an error numeral has in common for later described two error-position arithmetic units a plurality of input terminals for inputting the corresponding coefficients of an error-position polynomial, selecting portions (selectors), which corresponds to these coefficients, for selecting various values input at each input terminal at the beginning of only the initial cycle and, at the beginning of the subsequent cycles, those values input at the other input terminal, and a memory unit, which correspond to these coefficients, for storing (temporary memory) those values thus selected by these selecting portions by overwriting the previous values. It also has two arithmetic units corresponding to each of the coefficients, each of the two units comprising a Galois field multiplier, a full adder, a 0-decoder, an odd-number order summing unit, and an error-location counter.

With this, in the first cycle, the first error-position arithmetic unit on the downstream side and the second error-position arithmetic unit on the downstream side of the loop simultaneously perform the 2i'th power of $\alpha(i=1, 2, \ldots)$ and the (2i+1)'th power of $\alpha(i=0, 1, \ldots)$ respectively.

With this, also, the apparatus is so controlled that the error-location counter of the first error-position arithmetic unit is set at 0 at the first cycle and the error-location counter of the second error-position arithmetic unit is set at 1, for example, so that subsequently both of these error-location counters may count up by two for each cycle ("for example" here implies, as described later, that other configurations performing essentially the same actions may be included that comprises a first error-location counter which acts as a common error-location counter and a means for recognizing an error location value of the second Galois field multiplier unit based on the count value of the first error-location counter) and, further, for example, necessary wiring lines are connected between those units. Also, it is so controlled that arithmetic operations may be canceled when a necessary order number or a number of necessary cycles is attained or that each of the units may behave appropriately at their respective time points in each cycle in synchronization with the clock signal.

Specifically, for example, the output result of the first Galois field multiplier is held until the leading edge of the next clock cycle and, at the beginning of the next clock cycle, input immediately to the storage unit, based on which each process of the next cycle is performed.

Further, the apparatus is of course so controlled that since it has two Galois field multiplier units for simultaneously performing arithmetic operations of the (2i+1)'th power of $\alpha$ and the 2i'th power of $\alpha$, it as a rule has also two odd-number order summing unit and another two error-location counters unless in any special situation or device, thus enabling the downstream-side processing, for example, the outputting of a signal necessary for calculation of an error position.

According to a second aspect of the present invention, the chien's searching apparatus comprises, for further speedy error-numeral calculation therein, two Galois field multipliers for each coefficient also for the portion for calculating a numerator, like in the case of the denominator, in error-numeral calculation. With this, similar to error-position calculation at the numerator unit, Galois field multiplication operations of the 2i'th power and the (2i+1)'th power of $\alpha$ are performed simultaneously. Besides them, it has also two divisor units.

According to a third aspect of the present invention, the apparatus has only one divisor included in the second aspect, so that such control is conducted, for example, that according to values taken on by these two error-position polynomial arithmetic units, an input may be appropriately selected in using of the divisor, that, as necessary, the clock signal may be started or stopped or eventually the next calculation of a denominator and a numerator may be stopped until division is terminated, and that a state value of the register may be held. Further, to the processing unit on the downstream side is output a signal indicating which input has been selected.

Actually, however, the error rate is low, error correction operations are further accelerated.

Also, sharing of various functions is expected to reduce the area and space for arranging the circuits.

According to a fourth aspect of the present invention, same as the first aspect according to claim 1, the selector and the memory unit are each provided one but, unlike it, the arithmetic unit of the Galois field multiplier unit is provided three or more and, correspondingly, the full adder is also provided many. With this, as mentioned above, the actual error rate is low, thus further accelerating chien's searching operations.

The apparatus according to a fifth aspect of the present invention has the same actions and effects on the fourth aspect as those the second aspect has on the first aspect. Also, correspondingly, as compared to the second aspect according to claim 2 of the present invention, this aspect has many calculating units and so is complicated, providing various necessary control and signal outputs though.

The apparatus according to a sixth aspect of the present invention has the same actions on the fifth aspect as those the third aspect has on the second aspect. Also, correspondingly, as compared to the third aspect, this aspect has many calculating units and so is complicated, providing various necessary control and signal output though.

According to a seventh aspect of the present invention, when the summing unit of every error-position calculating unit in a plurality of error-position calculating units comes up with 0, the divisor is rendered inoperative, thus saving on power dissipation.

According to eighth and ninth aspects of the present invention, if the number of the solutions (roots) of an error-position polynomial becomes the same as the order of this equation in the first through seventh aspects, the process for obtaining the solutions of the following equations is stopped, thus further speeding chien's searching operations.

Figure 1:
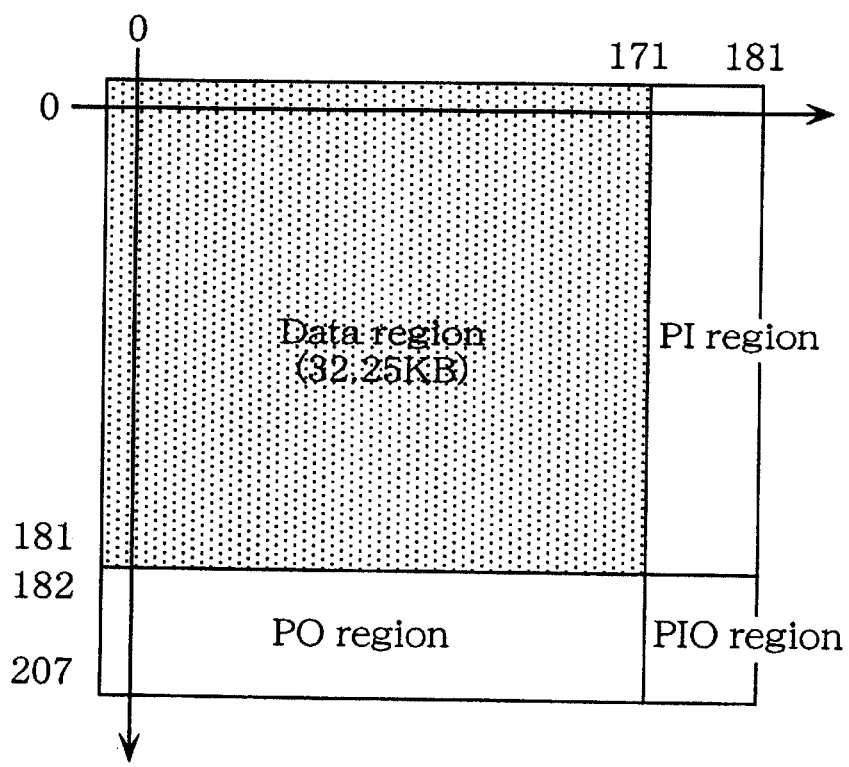
FIG. 1 is a configuration diagram of a DVD format of 1 ECC.

EXPLANATION OF REFERENCE NUMERALS 1 portion corresponding to the prior art chien's searching apparatus, 2 important portion of the chien's searching apparatus according to a fourth embodiment,
10 error-position polynomial calculating unit of the chien's searching apparatus of the present invention,
100 error-position polynomial calculating unit of the prior art chien's searching apparatus (and the first error-position arithmetic unit according to the embodiment),
1010–101p input terminal,
1020–102p (first) Galois field multiplier ("first" applies to the embodiment),
1030–103p selector,
1040–104p register (memory unit),
105 (first) full adder,
106 (first) 0-decoder,
107 (first) odd-number order summing unit,
108 (first) error-location counter,
158 shared error-location counter,
109 (first) error-location counter output signal terminal,
110 (first) error-position polynomial calculating unit output signal terminal,
111 (first) odd-number order summing unit output signal terminal,
200 second error-position polynomial calculating unit,
2010–201p second Galois field multiplier,
205 second full adder,
206 second 0-decoder unit,
207 second odd-number order summing unit,
208 second error-location counter,
209 second error-location counter output signal terminal,
210 second error-position calculating unit output signal terminal,
211 second odd-number order summing unit output signal terminal,
300 numerator calculating unit for prior art chien's searching apparatus error-numeral polynomial and first error-numeral polynomial numerator calculating unit of the embodiment,
3010–301p-1 input terminal (numerator side),
3020–302p-1 first Galois field multiplier (numerator side),
3030–303p-1 selector (numerator side),
3030–304p-1 register (memory unit, numerator side),
305 first full adder,
312 first error-numeral polynomial numerator side calculating unit output signal terminal,
400 second error-numeral polynomial numerator-side calculating unit,
4020–402p-1 second Galois field multiplier,
405 second full adder,
412 second error-numeral polynomial numerator-side calculating unit output signal terminal,
500 first error-numeral polynomial divisor,
514 (first) error-numeral polynomial divisor output signal terminal,
550 shared error-numeral polynomial divisor,
551 divisor controlling circuit,
552 first selector,
553 second selector,
600 second error-numeral polynomial divisor, and
614 second error-numeral polynomial divisor output signal terminal.

DESCRIPTION OF THE PREFERRED EMBODIMENTS

The following will describe a chien's searching apparatus of the present invention with reference to its embodiments.

First Embodiment

This embodiment relates to speeding of error position calculation.

Figure 4:
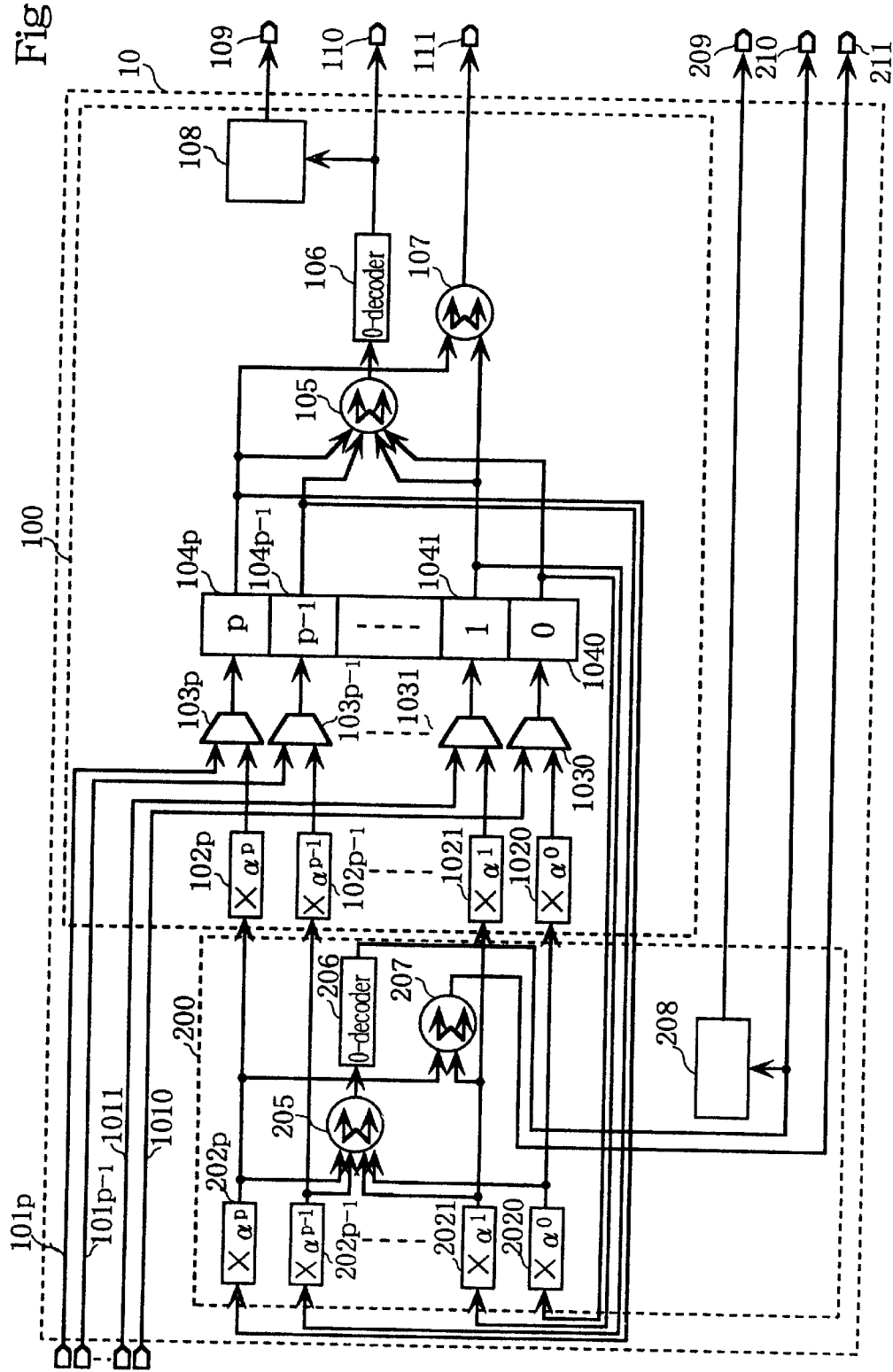
FIG. 4 is a configuration diagram of a chien's searching apparatus having a duplicated (two) error-position calculating unit according to a first embodiment of the present invention.

FIG. 4 is a configuration diagram of the chien's searching apparatus according to this embodiment, mainly corresponding to an aspect according to claim 1 of the present invention, which includes other components though. In this figure, the same element or components as those of the prior art are indicated by the same reference signs and, moreover, those elements or components have "2" in place of "1" of the corresponding ones of the prior art as the top numeral of the reference sign.

A reference numeral 10 indicates the body of the error-position polynomial calculating unit of the chien's searching apparatus, to which body are input coefficients Ap through A0 of the error-position polynomial from the upstream side of the correcting device and which outputs predetermined signals to a first error-position arithmetic unit output signal terminal 110, a second error-position arithmetic unit output signal terminal 210, an first error-location counter output signal terminal 109, a second error-location counter output signal terminal 209, a first odd-number order summing unit output signal terminal 111, and a first odd-number order summing unit output signal terminal 211.

Note here that the coefficients Ap through A0 of the error-position polynomial respectively indicate the coefficients of the following equation, which are the same as those of the prior art:

$$L(X) = ApX^p + \ldots + A1X^1 + A0$$

A reference numeral 100 indicates the first error-position arithmetic unit, which is basically the same as a prior art chien's searching apparatus and also which, instead of constituting a loop by itself in repetitive operations, is connected to a second arithmetic unit 200 related to the present invention, thus constituting a loop together with it.

The following will describe, by way of precaution, the blocks of the first error-position arithmetic unit, although it may overlap the prior art column to some extent.

Reference numerals 1030–103p indicate selector circuits which select as inputs the coefficients Ap–A0 of an error-position polynomial input from the outside, at the beginning of only the first cycle, and take in those input values to the first error-position arithmetic unit 100. In the following cycles, they select data input from the other terminal, i.e. the data input from the second Galois field multiplier (as a rule, in a small time lapse after the beginning of that cycle or later, because of some lapse of time necessary for arithmetic operations).

Reference numerals 1020–102p indicate first Galois field multipliers which perform Galois field multiplication on the coefficients of the error-position polynomial for each cycle following the first cycle. Once, as shown in this figure, a loop operation is started, however, the calculation results by the second Galois field multiplier are input, in contrast to the prior art.

Reference numerals 1040–104p indicate memory units which store values (those obtained by performing Galois field operations on coefficients of each order) of the terms of an error-position polynomial.

A reference numeral 105 indicates a first summing arithmetic unit for calculating a sum of the terms of the error-position polynomial at the beginning of each cycle following the first cycle.

A reference numeral 106 indicates a first 0-decoder which decides whether the value of the first summing arithmetic unit is 0 or not and, if it is 1, outputs at the first error-position arithmetic unit output signal terminal 110 a signal which tells that an error is present and, if it is 0, that no error is present.

A reference numeral 107 indicates a first odd-number order summing unit, which sums only the terms of odd-number orders of the memory unit and, if an error is distinct as a result of the decision of the first decoder unit, outputs this summing result to the first odd-number order summing unit output signal terminal 111 for processing in error-numeral polynomial operations at the next stage.

A reference numeral 108 indicates a first error-location counter which, if an error is distinct as a result of the decision by the first 0-decoder unit 106, outputs to the first error-location output signal terminal 110 the value stored at the relevant stored value as an error-position indicating value.

In the prior art chien's searching apparatus, on the other hand, the first error-position polynomial calculating unit 100, in the second cycle and subsequent, inputs values of the terms of error-position polynomials stored in the memory units 1040–104$p$ to the Galois field multipliers (1020–102$p$ in FIG. 4) of the same arithmetic unit, thus obtaining one solution in each cycle time. In this chien's searching apparatus, however, the values of the terms of the error-position polynomials stored in the memory units 1040–104$p$ are summed at the beginning of the cycle and, at the same time, input to the second error-position arithmetic unit 200. With this, two solutions are obtained in one cycle time.

The following will describe each of the components of this second error-position arithmetic unit.

Reference numerals 2020–202$p$ indicates second Galois field multipliers which perform Galois field multiplication on each of the coefficients of an error-position polynomial at the beginning of each cycle time.

A reference numeral 205 indicates a second summing arithmetic unit which sums the terms of an error-position polynomial obtained as a result of operations by the second Galois field multiplier.

A reference numeral 206 indicates a second 0-decoder which decides whether the value of the second summing arithmetic unit is 0 or not and, if it is 0, outputs to the second arithmetic unit output signal terminal 210 a signal which tells that an error is present and, if it is not 0, that no error is present.

A reference numeral 207 indicates a second odd-number order summing unit which sums only the terms of odd-number orders of the result by the second Galois field multiplier and, if an error is distinct as a result of the decision by the second 0-decoder unit 206, outputs this summing result to the second odd-number order summing unit output signal terminal 211 for use in processing by the error-numeral polynomial arithmetic (unit) at the next stage.

A reference numeral 208 indicates a second error-location counter which, if an error is distinct as a result of the decision by the second 0-decoder 206, outputs the relevant stored value as an error-position indicating value to the second error-location output signal terminal 209.

The following will describe the operations of this apparatus shown in FIG. 4.

In the initial cycle, the coefficients of error-position polynomials input from the input terminal 1010–101$p$ of this apparatus are selected by the selector 1030–103$p$ as inputs. Also, at the beginning of the initial cycle, the first error-location counter 108 is reset at 0 and the second error-location counter 208, at 1, both of which are incremented (counted up) by two for each subsequent cycle time.

With this, in the second cycle and subsequent also, the first error-position arithmetic unit 100 and the second error-position arithmetic unit 200 operate concurrently. The behavior is more specifically described as follows.

First, in the first error-position arithmetic unit 100, the values of the terms selected, at the beginning of the first cycle, by the selectors 1030–103$p$ and stored in the registers 1040–104$p$ are summed by the first summing unit 105. Next, thus obtained result is decided by the first the 0-decoder 109 on whether it is 0 or not. In the second error-position arithmetic unit 200, on the other hand, at the beginning of the second cycle, the second Galois field multipliers 2020–202$p$ perform Galois field multiplication on the values stored in the registers 1040–104$p$, the results of which are then summed in the same cycle by the second summing unit 205, so that the resultant sum is decided by the second 0-decoder 206 on whether an error is present therein.

Further, in the same cycle, the results in the second Galois field multipliers 2020–202$p$ are input in the first error-position arithmetic unit 100, to under go Galois field multiplication at its first Galois field multipliers 1020–102$p$, the multiplication results of which are input to the selectors 1030–103$p$ directly at the beginning of the next cycle.

Also, in the same cycle but at the same time or prior to these operations, the first error-location counter 108 and the second error-location counter 208 are both incremented by two.

In the subsequent cycles, until either of these two error-location counters reaches a predetermined value, both the arithmetic unit and the error-location counters repeat the above mentioned processing.

If, in this case, the first 0-decoder 106 decides that an error is present, the following operations are performed in the same cycle time:

The first odd-number order summing unit 107 sums only the terms of odd-number orders of error-position polynomials stored in the registers 1040–104$p$ and outputs the resultant sum via the first odd-number order sum output signal terminal 111 to the error-numeral calculating unit of the next stage. The first error-location counter 108 outputs a value at the time of error decision from the first error-location counter output signal terminal 109, thus propagating an error position.

Similarly, if the second 0-decoder 206 decides that an error is present, the following operations are performed in the same cycle time.

The second odd-number order summing unit 207 sums only the results of odd-number orders of the second Galois field multipliers 2020–202$p$ and outputs the resultant sum via the second odd-number order sum output signal terminal 211 to the error-position polynomial calculating unit of the next stage. The second error-location counter 208 outputs a value at the time of error decision from the second error-location counter output signal terminal 209, thus propagating an error position. Thus, error numerals are calculated.

As can be seen from the above, in the chien's searching apparatus of the present invention, the two arithmetic units can operate concurrently, to obtain two solutions in one cycle time, thus improving throughput in obtaining of solutions.

Second Embodiment

This embodiment relates to speeding of error numeral calculation.

Figure 5:
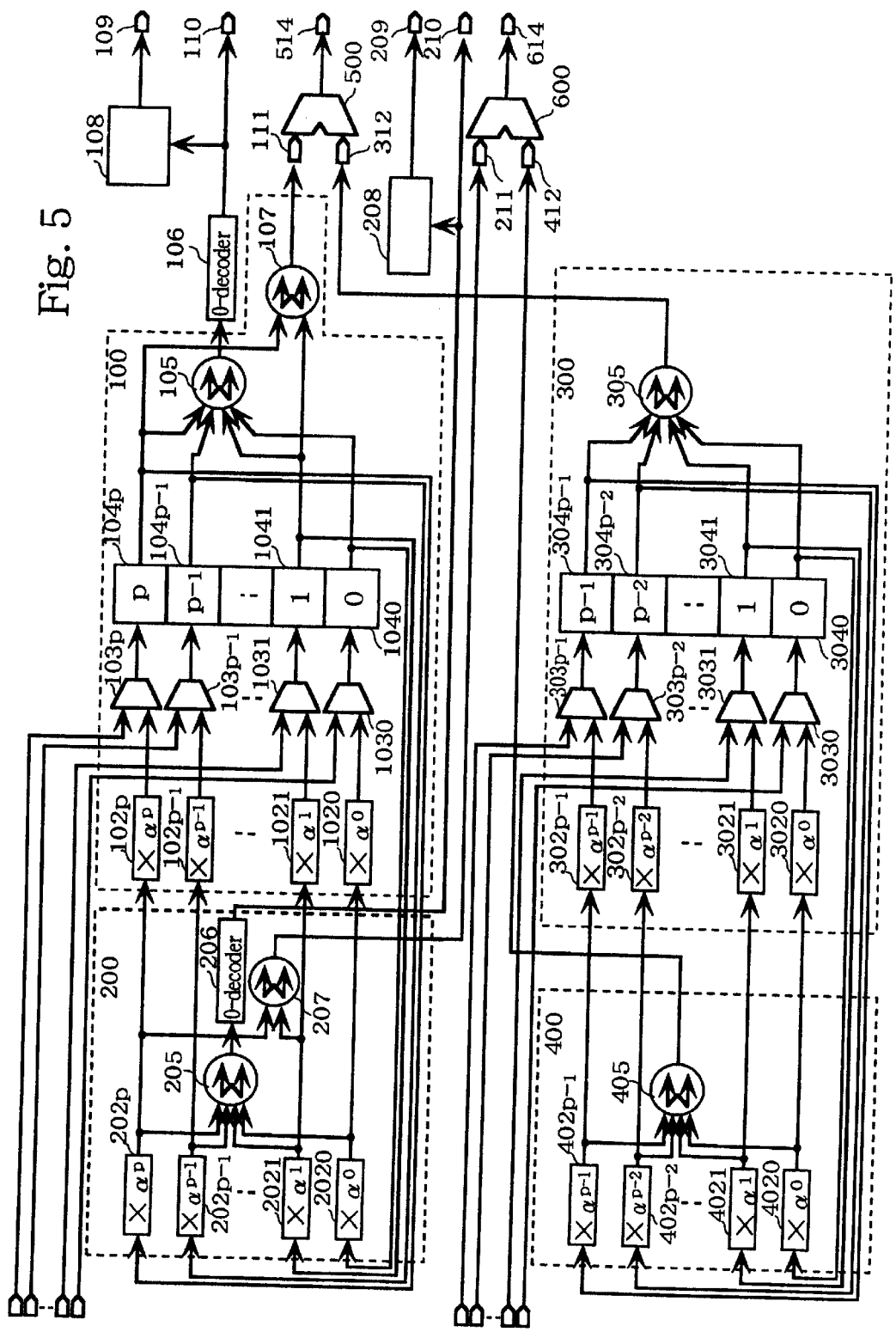
FIG. 5 is a configuration diagram of the chien's searching apparatus as a whole according to a second embodiment of the present invention.

FIG. 5 is a configuration diagram of the chien's searching apparatus according to this embodiment, mainly corresponding to the second aspect of the present invention according to claim 2. Error-position calculating units 100 and 200 shown at the upper part of the figure are the same as those shown in FIG. 4, part of which mainly constitutes the arithmetic unit for operating a denominator of an error-numeral polynomial. At the lower part of the figure are shown calculating units 300 and 400 for calculating a numerator of the error-numeral polynomial, the numerator calculating unit 300 being basically the same as the upper-part error-position polynomial calculating unit 100. As described in the prior art column, however, this embodiment differs from the prior art in that it has no input to the p-th order digit and there are no summing unit nor 0-decoder. Moreover, there is no error-location counters either.

The numerator calculating unit 400 is also basically the same as the upper-part (second) error-position polynomial calculating unit 200.

Besides the above, as shown in this figure, in the portion corresponding to the error-position polynomial calculating unit 100, the number of the most significant digits is increased by two. That is, for example, the numerator-side first and second Galois field multipliers come in 3020 through 302$p$-1 and 4020 through 402$p$-1 respectively. Note here that the corresponding first Galois field multipliers of the error-position calculating unit are indicated by 1020 through 102$p$-1 and 2020 through 202$p$-1. Further, there are provided denominator-side elements 102$p$ and 202$p$, to which nothing corresponds on the numerator side.

With this also, when inputs are provided from the numerator-side first or second Galois field multipliers to the numerator-side first full adder 305 or the second full adder 405, no input as multiplied by $\alpha^p$ are input to them in contrast to the corresponding denominator-side full adders 105 and 205.

Reference numerals 500 and 600 indicate first and second error-numeral polynomial divisors respectively. To the first error-numeral polynomial divisor 500 are input those outputs from, respectively, the output signal terminal 111 of the first odd-number order full adder 107 on the denominator side and the output signal terminal 312 of the first full adder 305 on the numerator side. Also, to the second error-numeral polynomial divisor 600 are input those outputs from, respectively, the output signal terminal 211 of the second odd-number order full adder 207 on the denominator side and the output signal terminal 412 of the second full adder 405 on the numerator side.

With the above, the two divisors 500 and 600 perform concurrent and high-speed division, the results of which are output from their respective output signal terminals 514 and 614.

Third Embodiment

This embodiment attempts to use in a shared manner an error-location counter and a divisor in the above mentioned second embodiment.

Figure 6:
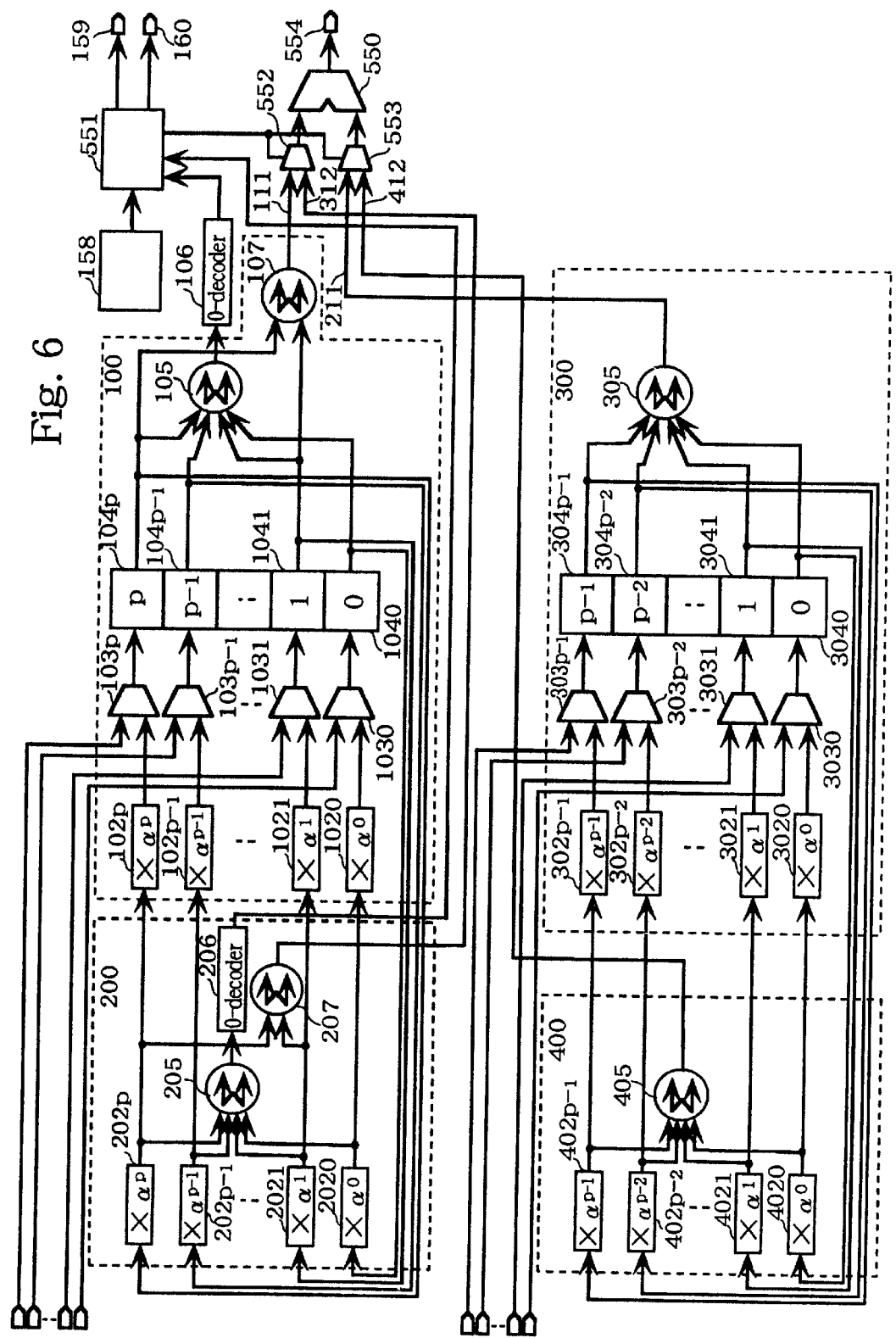
FIG. 6 is a configuration diagram of the chien's searching apparatus as a whole according to a third embodiment of the present invention.

A chien's searching apparatus according to this embodiment is shown in FIG. 6. This figure mainly relates to the third aspect of the present invention according to claim 3, so that the chien's searching apparatus of this embodiment is basically the same as that shown in FIG. 5 except that it has the error-numeral polynomial divisor unit in a shared manner. Therefore, the components and elements having the same actions as those of FIG. 4 are indicated by the same reference numerals except for those peculiar to this embodiment.

In this figure, a reference numeral 550 indicates a shared error-numeral polynomial divisor. A reference numeral 158 indicates a shared error-location counter. A reference numeral 551 indicates a divisor controlling circuit. Reference numerals 552 and 553 indicate respective selectors which make such selection that the divisor should receive inputs from the summing unit of the denominator side, the numerator side, or both of them like in the case of the first summing units of the denominator and numerator sides.

The following will describe the operations of this chien's searching apparatus.

The error-location counter is at 0 in the initial cycle and incremented by two for each cycle. With this, an error position is determined by recognizing that this only one error-location counter's value and the first 0-decoder, the second 0-decoder, or both of them come up with a value of 0. Circuits etc. required to this end, however, are not so difficult and so are not detailed here.

Next, the divisor controlling circuit 551 has to select a divisor to be used, according to values of the first and second full adders of the error-position polynomial calculating unit, to start or stop the clock signal as required, the actions of which are described as follows.

First, as for input/output for this circuit, to this circuit are input those output values of the first 0-decoder 106, the second 0-decoder 206, and the common error-location counter 158. With this, it outputs a value of the error-location counter to be passed over to the following stages, the decision results of the 0-decoder, the control (select) signal of the selector of the error-numeral polynomial divisor input unit, and a clock signal for starting and stopping the registers 1040–104$p$ and 3040–304$p$-1 on both of the denominator and numerator sides and the shared error-location counter 158.

Next, as for its operations, the following control is conducted according to the results of decision by the first and second 0-decoders 106 and 206 to be input.

1) When both of the 0-decoders provide output value of 0 (which means no error is present) (which can be easily recognizable because the sum of the output values of these two 0-decoders is 0)

1. Although any value may be output to the output signal terminal 159 of the error-location counter because it is ignored at the subsequent stage, this embodiment places and output of 0 in order to completely prevent malfunction due to any cause.
2. The 0-decoder also outputs a decision result of 0 (not error is present).
3. Outputs are fixed to the selectors 552 and 553 on the upstream side of the input unit of the divisor, i.e. a CLOSE signal is output to block a flow toward the subsequent stream side. With this, the divisor is rendered inoperative, to thus save on power dissipation.
4. The signal is held as is which controls the clock signal fed to the registers etc. With this, the clock signal continues to be output, to keep going the error-position calculation etc. in progress. That is, the same operations as the second embodiment are performed.

2) When only the first 0-decoder provides a decision result of 1 (which means an error is present) (which is recognized by recognizing that the sum of the output values of the two 0-decoders is 1 to thereby recognize that one of the two 0-decoders has a decision result of 1 and then recognizing which of them has that result of 1.)

1. A value of the error-location counter to be passed over to the subsequent stage is kept at the exact value of the shared error-location counter 158.
2. One (1) is output to the common 0-decoder at its output signal terminal 160, to notify it of a decision result indicating the presence of an error.
3. The denominator side outputs 111 and the numerator side outputs 312 to the selectors 552 and 553 on the upstream side of the input unit of the divisor, i.e. the OPEN/CLOSE (SELECT) signal is output which causes in both cases the output to be selected from the terminal on the side of the first calculating unit.
4. The signal which controls the clock signal fed to the registers etc. is held as is.

Under these conditions, the common divisor outputs at its output signal terminal 554 the results of division.

3) When only the second 0-decoder provides a decision result of 1
1. A value of the error-location counter to be passed over to the subsequent stage is a value of the common error-location counter 158 plus one (1). With this, the processing unit on the subsequent stream side recognizes the second full adder of the calculating unit of the error-position polynomial.
2. The 0-decoder outputs a decision result of 1.
3. The denominator side outputs 211 and the numerator side outputs 412 to the selectors 552 and 553 on the upstream side of the input unit of the divisor, i.e. the signal is output that causes in both cases the output to be selected from the terminal of the side of the second calculating unit.
4. The clock-signal controlling signal does nothing.

4) When both of the 0-decoders provide a decision result of 1 (which is easily recognizable because the sum of the output values of the two 0-decoders is 2.)
1. A control signal which stops the operations only for one clock is output as a control signal for controlling the clock signal for the registers 1040–104$p$ and 3040–304$p$-1 on the denominator and numerator sides and the common error-location counter 158. With this, only for the next one cycle the calculating units on the denominator and numerator sides and the error counter stay as they are, i.e. they holds the current values.
2. As a value to be passed over to the subsequent stage, first the value of the common error-location counter 158 is output as is.
3. The 0-decoder provides 1 as its decision result.
4. First the denominator side outputs 111 and the numerator side outputs 312 to the selectors 552 and 553 on the upstream side of the input unit of the divisor, i.e. a signal is output which, in both cases, select an output from the terminal of the first calculating unit side.
5. Immediately after the divisor performs arithmetic operation to thus output the results, the next clock signal cycle is given.
6. In this clock signal cycle, the registers 1040–104$p$ and 3040–304$p$-1 on the denominator and numerator sides do not latch new value, to thus hold the previous results. Therefore, at the output terminals 211 and 412 of the denominator and numerator sides appear the previous values, i.e. the values at a point when an error is found.
7. This time, the output value of the error counter to be passed over to the subsequent stage is a value of the common error-location counter 158 as holding the previous value plus one (1).
8. The 0-decoder provides its decision result of 1 (which means an error is present).
9. this time, the denominator side outputs 211 and the numerator side outputs 412 to the selectors 552 and 553 on the upstream side of the input unit of the divisor, i.e. a signal is output that in both cases selects an output from the terminal of the second calculating unit side.
10. A signal which release the instruction of stopping the clock signal is output as the signal for controlling the clock signal for the registers 1040–104$p$ and 3040–304$p$-1 on the denominator and numerator sides and the common error-location counter 158. That is, the registers on the denominator and numerator sides, the error-location counter, and the calculating units return to a normal operation from the next clock signal cycle onward.

As can be seen from the above description, according to this embodiment, only when an error is found on both of the two calculating units operating concurrently on the denominator side, the clock signal of the chien's searching apparatus is stopped. Therefore, where an error is found consecutively, instead of double throughput, only one solution can be given for each cycle time. However, the error rate (indicating in % the number of error bytes in the already mentioned one ECC block) is generally low for DVD-ROM and the like, actually 0.5% at the maximum and typically in an order of 0.0001% or less and does not matter so much.

That is, the chien's searching apparatus according to this embodiment can speedily find a few errors in very many error-position polynomials. On the other hand, however, it takes time to some extent to correct an error if any, which does not matter so much because the error occurring frequency is low. (Just for reference, the division speed is about five times that of Galois field multiplication or summing.).

Next, in contrast to the second embodiment, in the chien's searching apparatus according to this embodiment, the divisor and the error-location counter are decremented by one, while the control circuit for the divisor and the selectors (×2) of the input unit of the divisor are incremented. Note here that the control circuit for the divisor can be relatively easily designed and the selectors of the input unit of the divisor are very small circuits (both of which take about ⅕ area of the divisor). Therefore, preferably the divisor might well be decreased in terms of area.

Also, when no error was found in either of the two chien's searching apparatuses, which is quite common, the divisor is rendered inoperative. As a result, it is possible to reduce power dissipation due to a through current during operation. Note here that the divisor performs division on variables, thus constituting a large circuit always. (Just for reference, it takes almost the same area of the Galois field multiplier unit containing a large number of Galois field multipliers or the registers as a whole.) Therefore, this operation can be stopped when the apparatus is not in use, thus largely saving on power.

When, for example, the Galois field multiplier is provided four and if the sum of the values of the four 0-decoders is 0, an error-free state can be recognized. If the sum is 1, it is decided whether the sum of the values of the first and second 0-decoders and the sum of the third and fourth 0-decoders are 0 or not. As a result, the pair having 0 as the sum is recognized error-free. If the sum of the values of the first and second 0-decoders is 1, it is decided which one of them has a value 1. If both of them are 1, both are subject to processing, after which it is decided whether the sum of the values of the third and fourth 0-decoders is 0 or not. Then, the same procedure is repeated in processing. In this case also, the actual error rate is lower, so that this recognition processing does not matter so much.

Although the present invention has been described with reference to its embodiments, the present invention is not limited to them of course. That is, for example, the following embodiment is also possible.

Fourth Embodiment

This embodiment of the present invention attempts to further speeding the processing in addition to the above mentioned three embodiments. To this end, in processing of obtaining solutions of an error-position polynomial, this embodiment counts the number of thus obtained solutions and, when the sum reaches the order of the polynomial, stops the subsequent calculation for obtaining the solution.

First, the principles of this embodiment are described.

The error-position polynomial does not come up with a multiple root as a result of the preceding Euclidean operations except when too many error to correct occurred due to, for example, tampering of a DVD by a child. Therefore, the number of the roots obtained is equal to the order by the fundamental theory of algebra. With this, when the number of the obtained solutions is equal to the order of the polynomial, the operations for obtaining the solution may be stopped.

Figure 7:
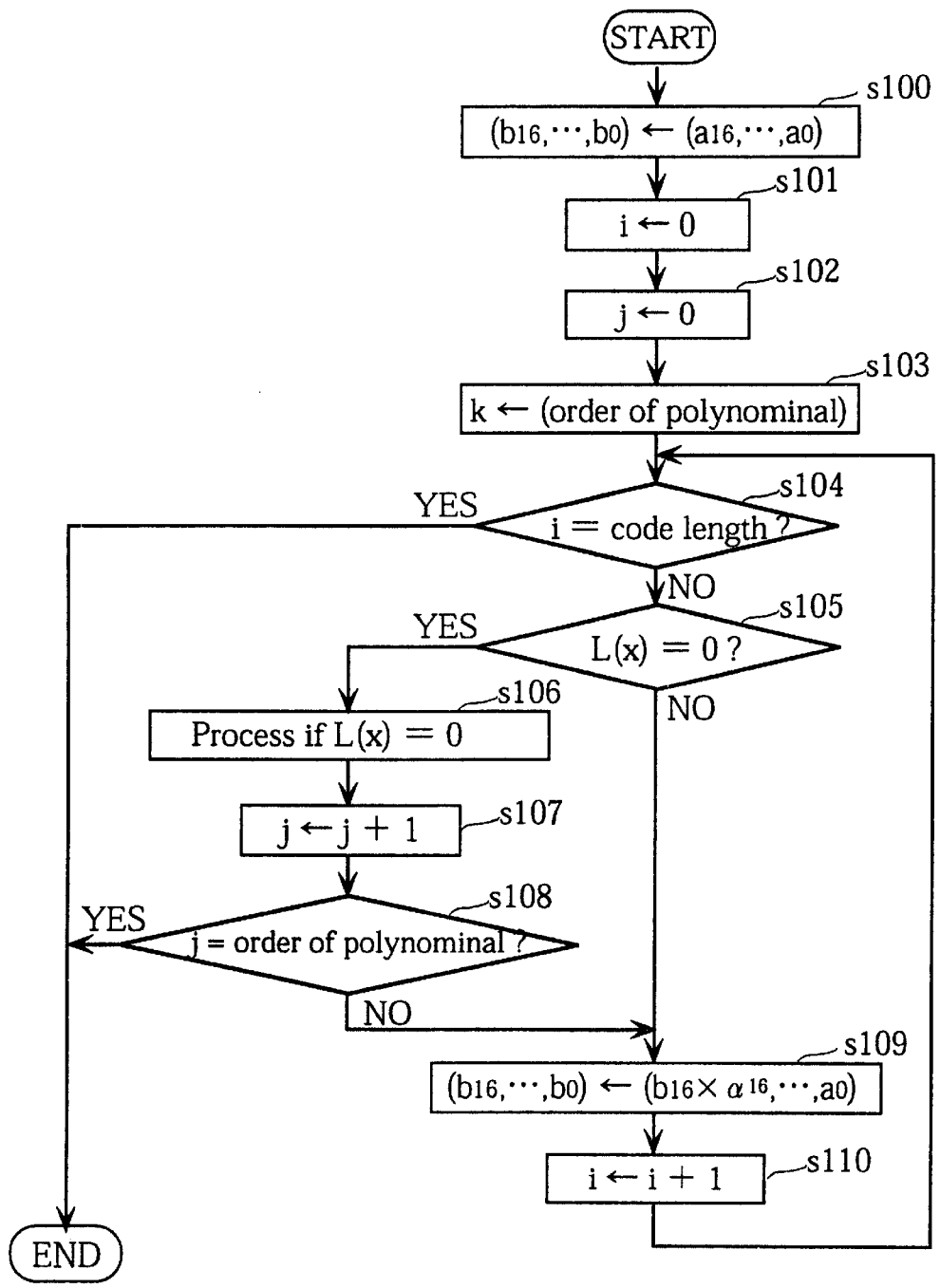
FIG. 7 is a flow chart showing a procedure for the chien's searching apparatus according to a fourth embodiment of the present invention to stop obtaining solutions of polynomials under certain requirements.

The following will describe the procedure for this processing with reference to FIG. 7.

In this figure, s102, s103, s107, and a108 are the steps peculiar to this embodiment.

Figure 2:
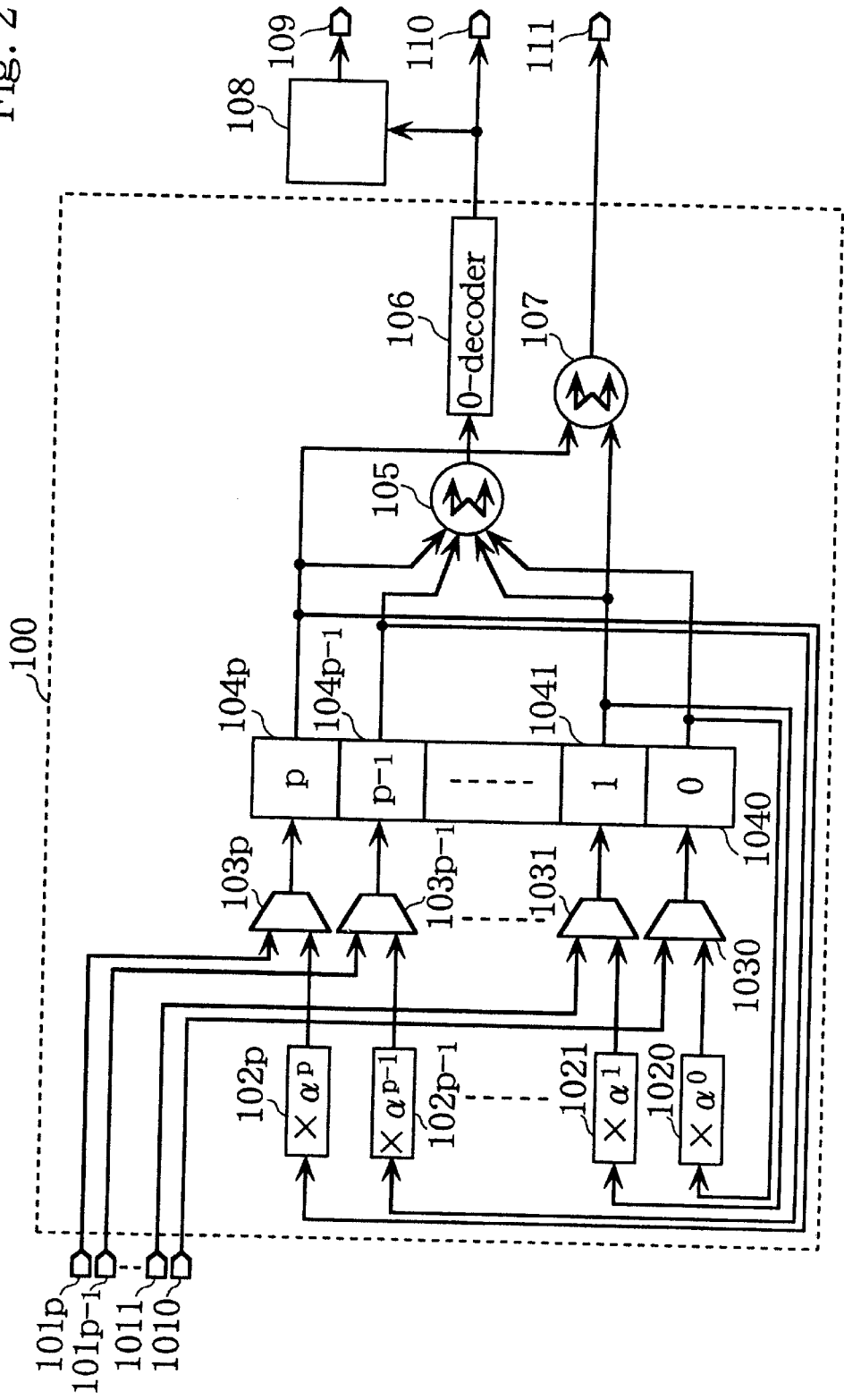
FIG. 2 is a configuration diagram of an error-position calculating unit of a prior art chien's searching apparatus.
Figure 3:
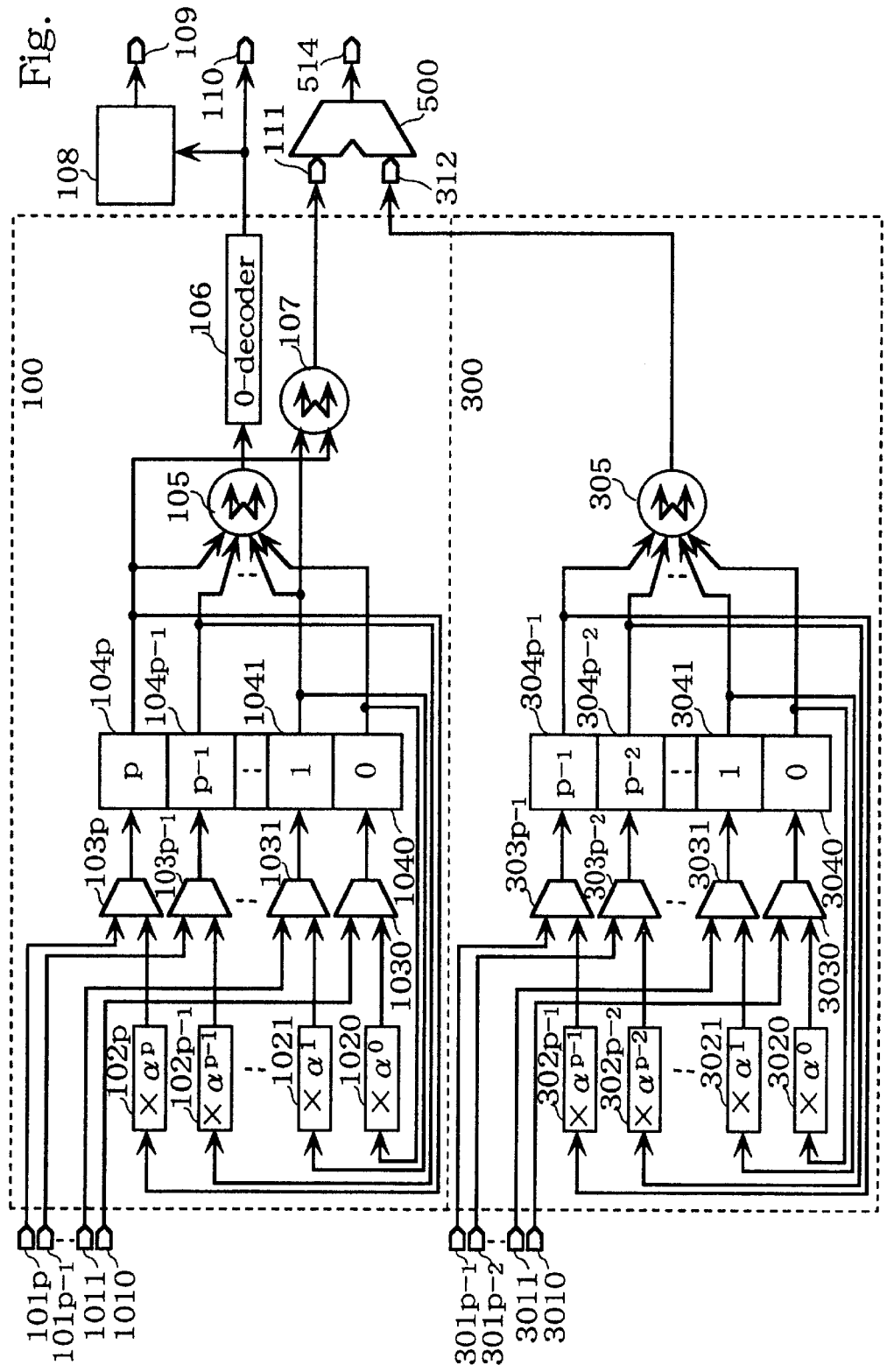
FIG. 3 is a configuration diagram of a whole (an error-position calculating unit, an error-numeral calculating unit, and a divisor unit) of the prior art chien's searching apparatus.

(s100): the coefficients ($a_{16}, \ldots, a_0$) (corresponding to 1010–101$p$ in FIG. 2 etc. and being put down in such a manner to save the space) of a polynomial L(x) to be input are loaded in an intermediate-result storage array ($b_{16}, \ldots, b_0$).

(s101): the number of times, i, of deciding whether L(x)=0 is counted.

(s102): a variable j is initialized which counts the number of x (solutions) which satisfy L(x)=0.

(s103): the circuit for obtaining the preceding L(x) posts the order of L(x), which is then stored.

(s104): If the number of times of deciding L(x)=0 is equal to the code length of an RS code, chien's searching is terminated.

(s105): Whether L(x)=0 is decided.

(s106): If L(x)=0, the error is corrected.

(s107): The number of the solutions obtained so far is obtained.

(s108): Each time a new solution is obtained, it is decided whether the number of the solutions obtained so far is equal to the order of the L(x). If they are equal, the subsequent processing for obtaining solutions is stopped.

(s109): The intermediate-result storage array is updated.

(s110): The number, i, of times of deciding whether L(x)=0 is incremented.

Figure 8:
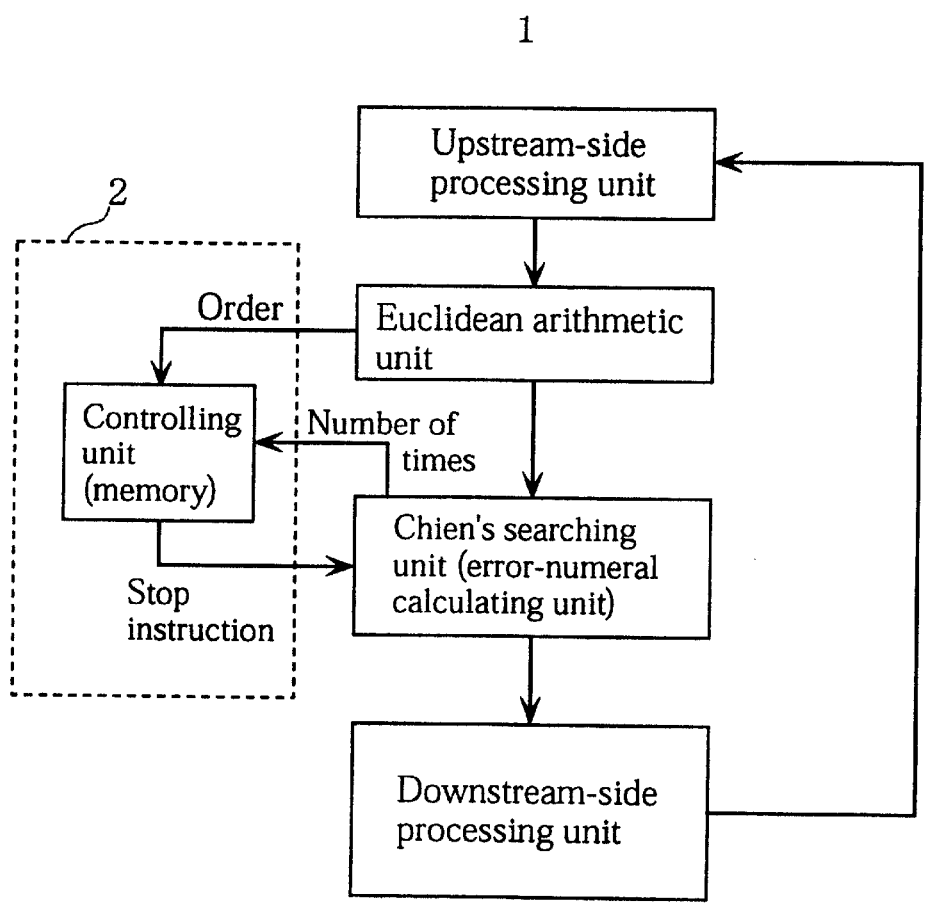
FIG. 8 is a configuration of the chien's searching apparatus as a whole according to the fourth embodiment of the present invention.

Note here that a control circuit is easy to design which posts or counts the number of solutions or, as a result thereof, stops operations. Resultantly, as shown in FIG. 8, only a small control circuit 2 has to be added to the existing processing circuit 1 which comprises may memories, arithmetic units, etc. If, on the other hand, the error rate is 0.5% as mentioned above, a DVD shown in FIG. 1 encounters an error at its one byte of vertical 208 data bytes at, on average, the middle in the vertical line. Therefore, the processing is stopped at around here, resulting in doubling the processing rate.

Although the present invention has been described with reference to its few embodiments, the present invention is not limited to them of course. That is, the following schemes are possible.

1) The arithmetic unit is provided three or more. Correspondingly, an appropriate value is given by which each error-location counter is incremented starting from an initial value.

In a configuration that the error-location counter is provided only one, which is set at 0 at the first cycle, so that in the following cycles, only the number of the arithmetic units is incremented, and when 0 is output correspondingly from 0-decoders, a means may be provided, no matter whether hardware-wise or software-wise, which can recognize which one of the 0-deciders to thereby find an error position, i.e. the means may provide essentially such a configuration that the error-location counter is provided only as many as the number of arithmetic units.

2) For example, in place of the selectors, the input terminal may receive inputs only in the initial cycle but not in the other cycles, while the Galois field multiplier provides no inputs in the initial cycle but in other cycles, or the terminal may act essentially as a selector, thus providing essentially the same or equal configuration as the configuration of the present invention, which may not completely agree with that though.

3) In contrast to the present configuration that each Galois field multiplier has a 16-bit capacity and each storage unit has an 8-bit capacity, a future configuration may have other bit capacities according to the future progress in technology and changes in specifications. Also, any type etc. of the memories of the storage unit or the Galois field multipliers may be employed.

4) According to this specification including claims, at the beginning of the first cycle, each register value is summed immediately and in the following cycles too, at their beginning the values are immediately read out and summed. More specifically, in the latter half of the first cycle, the value in each register is summed and, in the following cycles too, in their latter halves, the register value is read out. Correspondingly, the initial setting of the error-location counter etc. are also changed. That is, there is only such a difference in interpretation of the beginning of the cycle, thus providing essentially the same (or equivalent) apparatus.

5) In contrast to the configuration that the 0-decoders would, as a rule, give their decision in the same cycle, some compensating means may be given to provide a different configuration.

6) The beginning of the cycle is defined not the leading edge but the trailing edge of the clock signal.

Applicability to Industry and Effects of Invention

As can be seen from the above description, according to the present invention, by concurrently operating a plurality of arithmetic units provided in a chien's searching apparatus for obtaining an error position, the error correction operation can be speeded. Moreover, taking into account the actual error rate, the selector or register circuits etc. are shared among the plurality of arithmetic units, so that if the speed becomes N-fold, the circuit size does not become N-fold. Therefore, the present invention is very economical.

Also, in the same way as the above, a plurality of arithmetic units provided for obtaining denominators and numerators in error numeral calculation can be operated concurrently to thereby speed error correction. In this case also, the selector and register circuits etc. are shared among the plurality of arithmetic units, thus suppressing an increase in the circuit size.

Also, similarly, among the plurality of arithmetic units for obtaining denominators and numerators in error numeral calculation, the divisor unit is shared in use, to thereby miniaturize the circuitry and save on power dissipation.

Also, similarly, when the error-position calculation comes up with 0, the divisor unit is rendered inoperative, to thus further save on power dissipation.

Also, taking notice of the number of solutions obtained in error-position calculation and the order of equations, unnecessary processing is stopped to further improve the process speed.

What is claimed is:

1. A chien's searching apparatus comprising a denominator-side arithmetic unit for operating an error-numeral calculating equation:

an input terminal provided for each coefficient to which each coefficient of a error-position polynomial is input;

an selector unit connected to each input terminal for selecting each value input to said input terminal only in an initial cycle and, in the subsequent cycles, selecting each value input from the other input terminal;

a storage unit connected to said selector unit for storing each value selected by said selector unit;

a first summing unit for summing each value stored in said storage unit at the beginning of each cycle;

a first 0-decoder for deciding whether a value of an operation result of said first summing unit is 0 or not each time said operation result is output;

a second Galois field multiplier unit for causing a Galois field multiplier following said storage unit to performing, for each cycle, Galois field multiplication on each value stored in said storage unit;

a second summing unit for summing an operation result of said second Galois field multiplier unit for each cycle;

a second 0-decoder for deciding whether a value of an operation result of said second summing unit each time said operation result is output;

a first Galois field multiplier unit for causing the following Galois field multiplier to perform Galois field multiplication in the same cycle on a result of each Galois field multiplier of said second Galois field multiplier unit, to then input a result thereof to each of other input terminals of said selector unit;

a first error-location counter which is reset at 0 at a first cycle and, in each of the following cycles, incremented by two; and a second error-location counter which is reset at 1 at a first cycle and, in each of the following cycles, incremented by two;

wherein said apparatus further comprises an error-position specification processing unit for specifying an error position based on values of said two 0-decoders and values of said two error-location counters.

2. The chien's searching apparatus according to claim 1, wherein said denominator-side arithmetic unit further comprises:

a first odd-number order summing unit for summing outputs of an odd number from said first Galois field multiplier unit; and a second odd-number order summing unit for summing outputs of an odd number from said second Galois field multiplier unit; and said apparatus comprises as a numerator-side arithmetic unit for operating an error-numeral calculating equation:

a numerator-side input terminal provided for each coefficient to which each coefficient of a numerator of an error-numeral polynomial is input;

a numerator-side selector unit connected to each input terminal for selecting each value input to said numerator-side input terminal only in an initial cycle and, in the following cycles, selecting each value input from other input terminals;

a numerator-side storage unit connected to said numerator-side selector unit for storing each value selected by said numerator-side selector unit;

a numerator-side first summing unit for summing each value stored in said numerator-side storage unit at the beginning of each cycle;

a second Galois field multiplier unit for causing a numerator-side Galois field multiplier following said numerator-side storage unit to perform, for each cycle, Galois field multiplication on each value stored in said numerator-side storage unit;

a numerator-side second summing unit for summing an operation result of said numerator-side second Galois field multiplier unit for each cycle; and a first numerator-side Galois field multiplier unit for causing the following numerator-side Galois field multiplier to perform Galois field multiplication on a result of each Galois field multiplier of said numerator-side second Galois field multiplier unit, to then input a result thereof to each of other input terminals of said numerator-side selector unit; and said error-position specification processing unit comprises:

a first divider for performing division using as a denominator an output of said first odd-number order summing unit and as a numerator an output of said numerator-side first summing unit; and a second divider for performing division using as a denominator an output of said second odd-number order summing unit and as a numerator as output of said numerator-side second summing unit.

3. The chien's searching apparatus according to any one of claim 1, further comprising a power saving unit for rendering inoperative said error-position specification processing unit or a divider unit thereof if outputs of said 0-decoders are all 0.

4. The chien's searching apparatus according to claim 3, further comprising:

an order storage unit for storing an order of an error-position polynomial which is input prior to calculation of an error position;

a number-of-solutions storage unit for counting and storing the number of solutions each time a solution of the error-position polynomial is obtained; and an operation-stopping controlling unit for comparing a numeral in said order storage unit and a numeral in said number-of-solutions storage unit each time a count value in said number-of-solutions storage unit is updated and, if they agree, stopping the following operations for obtaining an solution of the error-position polynomial.

5. The chien's searching apparatus according to any one of claim 1, further comprising:

an order storage unit for storing an order of an error-position polynomial which is input prior to calculation of an error position;

a number-of-solutions storage unit for counting and storing the number of solutions each time a solution of an error-position polynomial is obtained; and an operation-stopping controlling unit for comparing a numeral stored in said order storage unit and a numeral in said number-of-solutions storage unit each time a count value in said number-of-solutions storage unit is updated and, if they agree, then stopping the following operations for obtaining a solution of the error-position polynomial.

6. A chien's searching apparatus comprising a denominator-side arithmetic unit for operating an error-numeral calculating equation:

an input terminal provided for each coefficient to which each coefficient of an error-position polynomial is input;

a selector unit for selecting each value input to said input terminal only in an initial cycle and, in the following cycles, selecting each value input from other input terminals;

a storage unit following said selector unit for storing each value selected by said selector unit;

a first summing unit for summing, for each cycle, each value stored in said storage unit;

a first 0-decoder for deciding whether a value of an operation result of said first summing unit each time said operation result is output;

a second Galois field multiplier unit for causing a Galois field multiplier following said storage unit to perform, for each cycle, Galois field multiplication on each value stored in said storage unit;

a second summing unit for summing an operation result of said second Galois field multiplier unit for each cycle;

a second 0-decoder for deciding whether a value of an operation result of said second summing unit each time said operation result is output;

a first Galois field multiplier unit for causing the following Galois field multiplier to perform Galois field multiplication in the same cycle on a result of each Galois field multiplier of said second Galois field multiplier unit, to then input a result thereof to each input terminal of said selector unit;

a first error-location counter which is reset at 0 in a first cycle and then incremented by two for each cycle;

a second error-location counter which is reset at 1 in a first cycle and then incremented by two for each cycle;

a first odd-number order summing unit for summing outputs of an odd number from said first Galois field multiplier unit; and a second odd-number order summing unit for summing outputs of an odd number from said second Galois field multiplier unit;

wherein:

said apparatus further comprises as a numerator-side arithmetic unit for operating an error-numeral calculating equation:

a numerator-side input terminal provided for each coefficient to which each coefficient of a numerator of an error-numeral polynomial;

a numerator-side selector unit connected to each input terminal for selecting each value input to said numerator-side input terminal only in an initial cycle and, in the following cycle, selecting each value input from other input terminals;

a numerator-side storage unit connected to said numerator-side selector unit for storing each value selected by said numerator-side selector unit;

a numerator-side first summing unit for summing each value stored in said numerator-side storage unit at the beginning of each cycle;

a numerator-side second Galois field multiplier unit for causing a numerator-side Galois field multiplier following said numerator-side storage unit to perform Galois field multiplication on each value stored in said numerator-side storage unit;

a second numerator-side summing unit for summing an operation result of said numerator-side second Galois field multiplier unit for each cycle; and a first numerator-side Galois field multiplier unit for causing the following numerator-side Galois field multiplier to perform in the same cycle Galois field multiplication on a result of each Galois field multiplier of said numerator-side second Galois field multiplier unit, to then input a result thereof to each of other input terminals of said numerator-side selector unit; and an error-position specification processing unit for specifying an error position based on values of said two 0-decoders and values of said two error-location counters comprises:

a divider unit for performing division using as a denominator an output, if any, from said first odd-number order summing unit and as a numerator an output, if any, from said numerator-side first summing unit and also using as a denominator an output, if any, from said second odd-number order summing unit and as a numerator an output, if any, from said second numerator-side summing unit; and a plurality of division controlling units for conducting control in such a way that if said first and second 0-decoders both provides a value of 0, neither a combination of an output of said first odd-number order summing unit and an output of said first numerator-side summing unit nor a combination of an output of said second odd-number order summing unit and an output of said numerator-side second summing unit is input to said divider unit; if only one of values of said first and second 0-decoders is 0, only an output from said odd-number order summing unit, not corresponding, and an output from said numerator-side summing unit are input to said divider unit and, at the same time, a signal specifying to this effect is output to a subsequent stream side processing unit; and if values of said first and second 0-decoders are both 0, first an output of said first odd-number order summing unit and an output of said numerator-side first summing unit are input to said divider unit and, in the next cycle, an output of said second odd-number summing unit and an output of said second numerator-side summing unit are input to said divider unit and also, each calculating unit and selector are stopped long enough to effectuate two division operations at said divider unit, or a state value is held.

7. A chien's searching apparatus comprising a denominator-side arithmetic unit for operating an error-numeral calculating equation:

an input terminal provided for each coefficient to which each coefficient of an error-position polynomial is input;

a selector unit connected to said input terminal for selecting each value input to said input terminal only in an initial cycle and, in the following cycles, selecting each value input to other input terminals;

a storage unit connected to said selector unit for storing each value stored in said selector unit;

an n'th Galois field multiplier unit for causing a Galois field multiplier following said storage unit to perform, for each cycle, Galois field multiplication on each value stored in said storage unit;

an $(i-1)$'th Galois field multiplier unit for receiving an output of an upstream-side $i$'th Galois field multiplier ($i=n, n-1, \ldots, 3$) to cause the following Galois field multiplier to perform Galois field multiplication in the same cycle;

a first Galois field multiplier unit for receiving, for each cycle, an output from an upstream-side second Galois field multiplier unit, to output a value of said output to other input terminals of following said selector unit in the same cycle;

a first summing unit for summing each value stored in said storage unit at the beginning of each cycle;

second through n'th summing units for summing, in the same cycle, a value of a multiplication result from each Galois field multiplier unit except said first Galois field multiplier unit each time said result is output;

first through n'th 0-decoders provided for each summing unit for deciding whether a value of an operation result of each of said first through n'th summing units is 0 or not each time said result is output;

a first error-location counter which is reset at 0 in a first cycle and then incremented by n for each of the following cycles; and n'th through second error-location counters which correspond to said n'th through second Galois field multiplier units respectively and which are reset at 1, ..., n−1 respectively in a first cycle and then incremented by n in each of the following cycles;

wherein said apparatus comprises an error-position specification processing unit for specifying an error position based on values of said n 0-decoders and said n error-location counters.

8. The chien's searching apparatus according to claim 7, wherein:

said denominator-side arithmetic unit further comprises an i'th odd-number order summing unit (i=1, 2, ..., n) for summing outputs of an odd-number order from said i'th Galois field multipliers (i=1, 2, ..., n);

said apparatus comprises as said numerator-side arithmetic unit for operating an error-numeral calculating equation:

a numerator-side input terminal provided for each coefficient to which each coefficient of a numerator of an error-numeral polynomial is input;

a numerator-side selector unit connected to said numerator-side input terminal for selecting each value input to said numerator-side input terminal only in an initial cycle and, in the following cycles, selecting each value input to other input terminals;

a numerator-side storage unit connected to said numerator-side selector unit for storing each value stored in said numerator-side selector unit;

a numerator-side n'th Galois field multiplier unit for causing a Galois field multiplier following said numerator-side storage unit to perform, for each cycle, Galois field multiplication on each value stored in said numerator-side storage unit;

a numerator-side (i−1)'th Galois field multiplier unit for receiving a numerator-side i'th Galois field multiplier unit (i=n, n−1, ..., 3) on the upstream side, to cause the following Galois field multiplier to perform Galois field multiplication in the same cycle;

a numerator-side first Galois field multiplier unit for receiving, for each cycle, an output from a numerator-side second Galois field multiplier unit on the upstream side, to output in the same cycle a value thereof to other input terminals of said numerator-side selector unit;

a numerator-side first summing unit for summing, at the beginning of each cycle, each value stored in said numerator-side storage unit; and numerator-side second through n'th summing units for summing an value of a multiplication result of each Galois field multiplier unit except said numerator-side first Galois field multiplier each time said result is output; and said error-position specification processing unit comprises an i'th divider unit (i=1, 2, ..., n) for performing division using as a denominator an output from said i'th odd-number order summing unit and as a numerator an output from said numerator-side i'th summing unit.

9. A chien's searching apparatus comprising a denominator-side arithmetic unit for operating an error-numeral calculating equation:

an input terminal provided for each coefficient to which each coefficient of an error-position polynomial is input;

a selector unit connected to said input terminal for selecting each value input to said input terminal only in an initial cycle and, in the following cycle, selecting each value input to other input terminals;

a storage unit connected to said selector unit for string each value stored in said selector unit;

an n'th Galois field multiplier unit for causing, for each cycle, a Galois field multiplier following said storage unit to perform Galois field multiplication on each value stored in said storage unit;

an (i−1)'th Galois field multiplier unit for receiving an output from an upstream-side i'th Galois field multiplier (i=n, n−1, ..., 3), to cause the following Galois field multiplier to perform, in the same cycle, Galois field multiplication;

a first Galois field multiplier unit for receiving, for each cycle, an output from an upstream-side second Galois field multiplier unit, to output in the same cycle a value thereof to other input terminals of said selector unit;

a first summing unit for summing each value stored in said storage unit at the beginning of each cycle;

second through n'th summing units for summing a value of a multiplication result from each Galois field multiplier unit except said first Galois field multiplier each time said result is output;

first through n'th 0-decoders for deciding whether a value of an operation result from said first through n'th summing units is 0 or not each time said result is output;

a first error-location counter which is reset at 0 at a first cycle and then incremented by n for each of the following cycles;

error-location-value count recognizing means provided for each Galois field multiplier which has essentially the same actions as n'th through second error-location counters corresponding to n'th through second Galois field multipliers which are reset at 1, . . , n−1 respectively and then incremented by n or which does so together with said first error-location counter; and i'th odd-number order summing unit (i=1, 2, ..., n) for summing outputs of an odd number from said i'th Galois field multiplier unit (i=1, 2, ..., n);

wherein:

said apparatus comprises as a numerator-side arithmetic unit for operating an error-numeral calculating equation:

a numerator-side input terminal provided for each coefficient to which each coefficient of a numerator of an error-numeral polynomial is input;

a numerator-side selector unit connected to said numerator-side input terminal for selecting each value input to said numeral-side input terminal only in an initial cycle and, in the following cycles, selecting each value input to other input terminals;

a numerator-side storage unit connected to said numerator-side selector unit for storing each value stored in said numerator-side selector unit;

an n'th Galois field multiplier unit for causing, for each cycle, a Galois field multiplier following said numeral-side storage unit to perform Galois field multiplication on each value stored in said numerator-side storage unit;

a numerator-side (i−1)'th Galois field multiplier unit for receiving an output from a numerator-side i'th Galois field multiplier unit (i=n, n−1, . . . , 3) on the upstream side, to causing, in the same cycle, the following Galois field multiplier to perform Galois field multiplication;

a numerator-side first Galois field multiplier unit for receiving, for each cycle, an output from a numerator-side second Galois field multiplier unit on the upstream side, to output in the same cycle a value thereof to other input terminals of said numerator-side selector unit;

a numerator-side first summing unit for summing each value stored in said numerator-side storage unit at the beginning of each cycle; and a numerator-side second through n'th summing units for summing in the same cycle a value of a multiplication result from each Galois field multiplier unit except said numerator-side Galois field multiplier unit each time said result is output; and an error-position specification processing unit for specifying an error position based on values of said n 0-decoders and said n error-location counters or values of said n 0-decoders and said first error-location counter and also recognition contents by said error-location-value count recognizing means comprises:

a divider unit for performing division by using as a denominator an output, if any, from said i'th odd-number order summing unit and as a numerator an output from said numerator-side i'th summing unit; and a plurality of division controlling units providing control in such a way that if values of said first through n'th 0-decoders are all 0, none of combinations of outputs from said first through n'th odd-number order summing units and outputs from said numerator-side summing units is input to said divider unit; and if any one of values of said first through n'th 0-decoders is 0, combinations of outputs from corresponding ones of said odd-number order summing units and outputs from said numerator-side summing units are sequentially input in each cycle to said divider unit in an ascending order and, at the same time, a signal specifying a 0-decoder of interest is output to a downstream-side processing unit and also, each calculating unit and selector are stopped long enough to effectuate a plurality of division operations at said divider unit, or a state value is held.

\* \* \* \* \*

UNITED STATES PATENT AND TRADEMARK OFFICE
CERTIFICATE OF CORRECTION

PATENT NO.     : 6,647,529 B2
DATED          : November 11, 2003
INVENTOR(S)    : Masanori Hirofuji et al.

It is certified that error appears in the above-identified patent and that said Letters Patent is hereby corrected as shown below:

Column 17,
Line 6, change "a" to -- an --.
Line 7, change "an" to -- a --.

Column 18,
Line 29, delete "any one".
Line 30, delete "of".
Line 46, change "agree, stopping" to -- agree, then stopping --.
Line 47, change "an solution" to -- a solution --.
Line 49, delete "any one".
Line 50, delete "of".
Line 55, change "an" to -- the --.

Column 22,
Line 21, change "string" to -- storing --.

Signed and Sealed this

Thirteenth Day of July, 2004

JON W. DUDAS
*Acting Director of the United States Patent and Trademark Office*